United States Patent
Maekawa et al.

(10) Patent No.: US 9,496,433 B2
(45) Date of Patent: Nov. 15, 2016

(54) PHOTOELECTRIC CONVERSION DEVICE AND METHOD FOR MANUFACTURING PHOTOELECTRIC CONVERSION DEVICE

(71) Applicants: ROHM CO., LTD., Kyoto (JP); National Institute of Advanced Industrial Science and Technology, Tokyo (JP)

(72) Inventors: Takuji Maekawa, Kyoto (JP); Shigeru Niki, Tsukuba (JP); Shogo Ishizuka, Tsukuba (JP); Hajime Shibata, Tsukuba (JP)

(73) Assignees: ROHM CO., LTD., Kyoto (JP); NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 14/436,075

(22) PCT Filed: Oct. 10, 2013

(86) PCT No.: PCT/JP2013/077648
§ 371 (c)(1),
(2) Date: Apr. 15, 2015

(87) PCT Pub. No.: WO2014/061561
PCT Pub. Date: Apr. 24, 2014

(65) Prior Publication Data
US 2015/0303330 A1    Oct. 22, 2015

(30) Foreign Application Priority Data

Oct. 16, 2012  (JP) .................. 2012-229142

(51) Int. Cl.
*H01L 31/0272*    (2006.01)
*H01L 31/065*    (2012.01)
(Continued)

(52) U.S. Cl.
CPC ..... *H01L 31/0322* (2013.01); *H01L 27/14643* (2013.01); *H01L 27/14665* (2013.01);
(Continued)

(58) Field of Classification Search
CPC ............... H01L 31/0322; H01L 31/03923; H01L 31/022466; H01L 31/10; H01L 31/18; H01L 27/14643; H01L 27/14665; H01L 27/14694; Y02E 10/541; Y02E 10/543
USPC .......... 136/255, 262, 264; 257/48, 292, 294, 257/435, E31.026, E31.113, E31.126, 257/E21.09, E21.461; 438/73, 95, 509
See application file for complete search history.

(56) References Cited

U.S. PATENT DOCUMENTS

| 5,728,231 A | 3/1998 | Negami et al. |
| 2006/0220059 A1 | 10/2006 | Satoh et al. |

(Continued)

FOREIGN PATENT DOCUMENTS

| JP | H-08-316230 A | 11/1996 |
| JP | 2004-342678 A | 12/2004 |

(Continued)

*Primary Examiner* — Dao H Nguyen
(74) *Attorney, Agent, or Firm* — Rabin & Berdo, P.C.

(57) ABSTRACT

The inventive photoelectric conversion device includes a substrate, a lower electrode layer provided on the substrate, a CIGS compound semiconductor layer provided on the lower electrode layer as covering the lower electrode layer, and a transparent electrode layer provided on the compound semiconductor layer, wherein the compound semiconductor layer has a maximum Ga content variation of not less than 5% as measured in a layer thickness direction, and a maximum In content variation of not less than 6% as measured in the layer thickness direction.

16 Claims, 9 Drawing Sheets

(51) Int. Cl.
*C23C 14/34* (2006.01)
*H01L 31/032* (2006.01)
*H01L 31/10* (2006.01)
*H01L 31/0224* (2006.01)
*H01L 31/0392* (2006.01)
*H01L 27/146* (2006.01)
*H01L 31/18* (2006.01)

(52) U.S. Cl.
CPC . *H01L27/14694* (2013.01); *H01L 31/022466* (2013.01); *H01L 31/03923* (2013.01); *H01L 31/10* (2013.01); *H01L 31/18* (2013.01); *Y02E 10/541* (2013.01); *Y02E 10/543* (2013.01); *Y02P 70/521* (2015.11)

(56) References Cited

U.S. PATENT DOCUMENTS

| | | | |
|---|---|---|---|
| 2011/0011460 A1* | 1/2011 | Munteanu | C23C 14/0057 136/264 |
| 2011/0180688 A1 | 7/2011 | Nakahara | |
| 2011/0205412 A1* | 8/2011 | Miyazaki | H01L 27/14621 348/294 |
| 2012/0017977 A1 | 1/2012 | Satou et al. | |
| 2012/0217498 A1* | 8/2012 | Yamanaka | H01L 27/1461 257/48 |
| 2013/0341694 A1* | 12/2013 | Maekawa | H01L 31/02164 257/294 |
| 2014/0069492 A1* | 3/2014 | Abe | H01L 31/0322 136/255 |
| 2015/0000743 A1* | 1/2015 | Miyamichi | H01L 31/0749 136/262 |

FOREIGN PATENT DOCUMENTS

| | | |
|---|---|---|
| JP | 2010-251694 A | 11/2010 |
| JP | 2011-151271 A | 8/2011 |
| JP | 2012-142342 A | 7/2012 |
| WO | WO-2004/090995 A1 | 10/2004 |

* cited by examiner

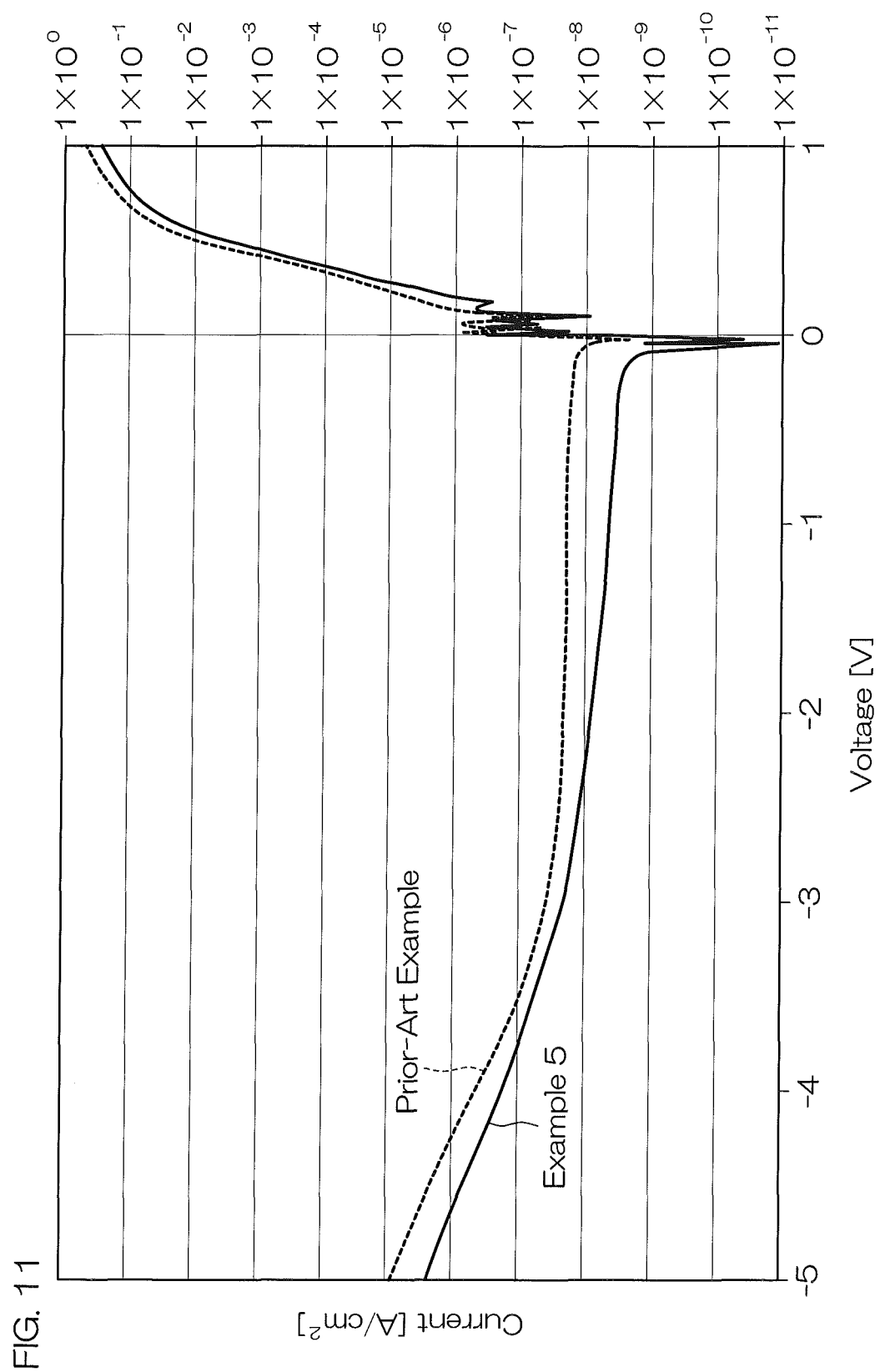

PHOTOELECTRIC CONVERSION DEVICE AND METHOD FOR MANUFACTURING PHOTOELECTRIC CONVERSION DEVICE

TECHNICAL FIELD

The present invention relates to a photoelectric conversion device including a CIGS compound semiconductor layer, and a method for manufacturing the same.

BACKGROUND ART

Photoelectric conversion devices employing CIGS semiconductors are conventionally known. For example, PTL1 discloses a solar cell which includes an electrode of a molybdenum (Mo) layer formed by sputtering, a photoelectric conversion layer or a light absorbing layer of a $Cu(In_{1-x}Ga_x)Se_2$ film, a buffer layer of a CdS layer formed by a solution growth method, a window layer of ZnO deposited by an MOCVD method, and an electrode of aluminum formed by vapor deposition or sputtering and patterning, these layers being provided in this order on a substrate of soda lime glass (SLG).

The photoelectric conversion layer is formed by a so-called three-step method, which includes the steps of: depositing a film of In—Ga—Se on the substrate; supplying Cu—Se to the In—Ga—Se film with heating to convert the In—Ga—Se film into a film of Cu—Se-rich $Cu(In_{1-x}Ga_x)Se_2$ containing excess Cu—Se; and supplying In—Ga—Se to the Cu—Se-rich $Cu(In_{1-x}Ga_x)Se_2$ film to convert the excess Cu—Se into $Cu(In_{1-x}Ga_x)Se_2$ to form a $Cu(In_{1-x}Ga_x)Se_2$ film (wherein $0<x\leq1$) and then removing a Cu—Se compound from a surface of the $Cu(In_{1-x}Ga_x)Se_2$ film.

CITATION LIST

Patent Literature

PTL1: JP2004-342678-A

SUMMARY OF INVENTION

Technical Problem

The CIGS (CuInGaSe) compound semiconductor has a band gap which is reduced as its composition approaches a CIS (CuInSe) compound semiconductor. This increases the sensitivity wavelength, but adversely increases the dark current. On the other hand, the band gap of the CIGS compound semiconductor is increased as its composition approaches a CGS (CuGaSe) compound semiconductor. In this case, the CIGS compound semiconductor has no sensitivity in a longer wavelength range, but has a reduced dark current.

Therefore, it is considered that the increase in sensitivity wavelength and the reduction in dark current can be simultaneously achieved if a CIS-like compositional structure and a CGS-like compositional structure coexist in the CIGS compound semiconductor.

In the prior-art three-step method, however, In and Ga are supplied at substantially the same rate in the steps other than the Cu—Se supplying step. Therefore, if one of the In composition ratio and the Ga composition ratio is increased, the other composition ratio is inevitably reduced. This makes it difficult to allow the CIGS compound semiconductor film to vary significantly in both the In composition ratio and the Ga composition ratio in a thickness direction thereof (to allow the CIGS compound semiconductor to have greater gradations (variations) in the In composition ratio and the Ga composition ratio) to permit the coexistence of the CIS-like compositional structure and the CGS-like compositional structure. Therefore, the prior-art CIGS film has a trade-off between the increase in sensitivity wavelength and the reduction in dark current.

It is an object of the present invention to provide a photoelectric conversion device having an increased sensitivity wavelength and a reduced dark current, and to provide a method for manufacturing the photoelectric conversion device.

Solution to Problem

The photoelectric conversion device according to the present invention includes a substrate, a lower electrode layer provided on the substrate, a CIGS compound semiconductor layer provided on the lower electrode layer as covering the lower electrode layer, and a transparent electrode layer provided on the compound semiconductor layer, wherein the compound semiconductor layer has a Ga content having a maximum variation of not less than 5% as measured in a layer thickness direction, and has an In content having a maximum variation of not less than 6% as measured in the layer thickness direction.

With this arrangement, the CIS-like compositional structure and the CGS-like compositional structure can coexist in the CIGS compound semiconductor layer. The CIS compositional structure or the CIS-like compositional structure increases the sensitivity wavelength. Further, the CGS compositional structure or the CGS-like compositional structure reduces the dark current. That is, the increase in sensitivity wavelength and the reduction in dark current can be simultaneously achieved.

The compound semiconductor layer preferably includes an intermediate portion in which the In content is greater than the Ga content, and an end portion in which the Ga content is greater than the In content, the end portion being disposed on an upper side and/or a lower side of the intermediate portion with respect to the layer thickness direction.

With this arrangement, the sensitivity wavelength can be effectively increased.

In the photoelectric conversion device, a difference in Ga content between the end portion and the intermediate portion may be not less than 5%, and a difference in In content between the intermediate portion and the end portion may be not less than 6%.

The intermediate portion preferably has an In content of 14 at % to 20 at % and a Ga content of 0 at % to 4 at %.

The intermediate portion preferably has a Ga composition ratio (Ga/Ga+In) of 0 to 0.17 with respect to the total amount of Ga and In, and an In composition ratio (In/Ga+In) of 0.83 to 1 with respect to the total amount of Ga and In.

The end portion preferably has a Ga content of 6 at % to 15 at %, and an In content of 0 at % to 8 at %.

The end portion preferably has a Ga composition ratio (Ga/Ga+In) of 0.65 to 1 with respect to the total amount of Ga and In, and an In composition ratio (In/Ga+In) of 0 to 0.35 with respect to the total amount of Ga and In.

The compound semiconductor layer preferably has an absorption wavelength of not less than 1200 nm.

The lower electrode layer may include a plurality of lower electrode layers arranged in spaced relation, and the compound semiconductor layer may be disposed over the plurality of lower electrode layers as collectively covering the lower electrode layers and include a plurality of compound semiconductor layer portions each defining a pixel.

With this arrangement, the photoelectric conversion device may be used as an image sensor.

The lower electrode layer may include a single lower electrode layer.

With this arrangement, the photoelectric conversion device may be used as a solar cell.

The photoelectric conversion device may include a circuit portion provided between the substrate and the lower electrode layer. The circuit portion may include a CMOS field effect transistor.

The CMOS field effect transistor may include a source layer and a drain layer formed selectively in a surface portion of the substrate, and a gate electrode disposed between the source layer and the drain layer.

The transparent electrode layer may be made of zinc oxide (ZnO) or indium tin oxide (ITO).

The photoelectric conversion device may further include a buffer layer provided between the compound semiconductor layer and the transparent electrode layer.

The buffer layer may be made of CdS, ZnS, ZnO, $(Zn_zMg_{1-z})O$ $(0 \leq z \leq 1)$, ZnSe or $In_2S_3$.

The method for manufacturing the photoelectric conversion device according to the present invention includes the steps of: forming a lower electrode layer on a substrate; forming a CIGS compound semiconductor layer covering the lower electrode layer; and forming a transparent electrode layer on the compound semiconductor layer; wherein the compound semiconductor layer forming step includes a Ga excessively supplying step of supplying Ga in a greater amount than In, a Cu supplying step of supplying Cu, and an In excessively supplying step of supplying In in a greater amount than Ga, whereby the compound semiconductor layer is formed so as to have a maximum Ga content variation of not less than 5% as measured in a layer thickness direction, and a maximum In content variation of not less than 6% as measured in the layer thickness direction.

In this method, the CIS compositional structure or the CIS-like compositional structure and the CGS compositional structure or the CGS-like compositional structure can coexist in the CIGS compound semiconductor layer. In the photoelectric conversion device produced by this method, therefore, the CIS compositional structure or the CIS-like compositional structure increases the sensitivity wavelength, and the CGS compositional structure or the CGS-like compositional structure reduces the dark current. That is, the increase in sensitivity wavelength and the reduction in dark current can be simultaneously achieved.

In the compound semiconductor layer forming step, it is preferred to first perform the Ga excessively supplying step after the formation of the lower electrode layer and then perform the In excessively supplying step and the Cu supplying step in this order.

In the compound semiconductor layer forming step, it is more preferred to perform the In excessively supplying step and the Ga excessively supplying step in this order after the Cu supplying step.

In the compound semiconductor layer forming step, it is preferred to finally perform the Ga excessively supplying step.

BRIEF DESCRIPTION OF DRAWINGS

FIG. 11 is a graph showing the dark current characteristics of the photoelectric conversion devices.

DESCRIPTION OF EMBODIMENTS

Embodiments of the present invention will hereinafter be described in detail with reference to the attached drawings.

Figure 1:
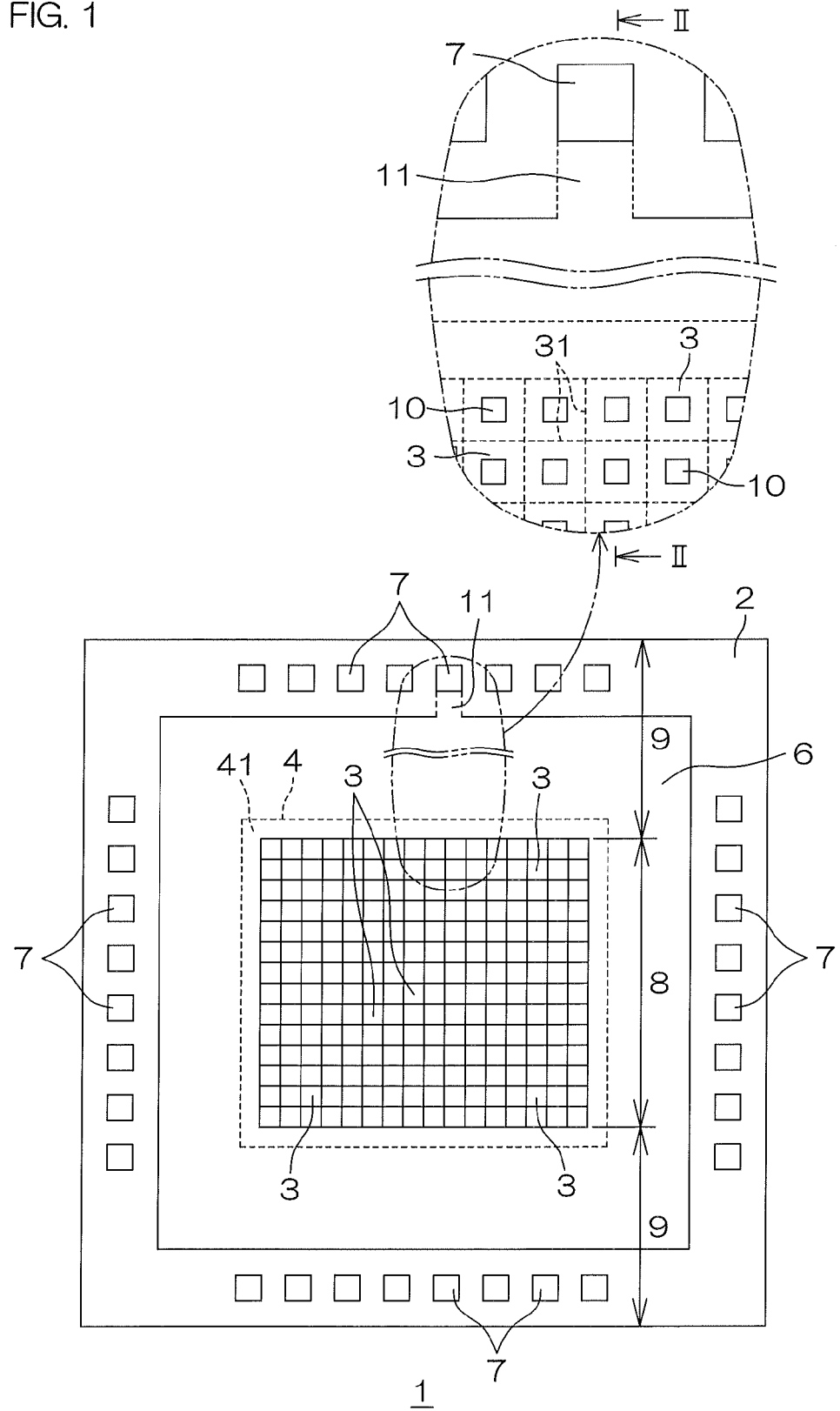
FIG. 1 is a schematic plan view of a photoelectric conversion device according to a first embodiment of the present invention.

FIG. 1 is a schematic plan view of a photoelectric conversion device according to a first embodiment of the present invention.

The photoelectric conversion device 1 is an image sensor which detects incident light and converts the energy of the light into electrical signals.

A plurality of such photoelectric conversion devices 1 may be one-dimensionally arranged for use as a line image sensor, or may be two-dimensionally arranged for use as an area image sensor. The photoelectric conversion device 1 may be used as an image sensor for a security camera (a camera which senses visible light in the daytime, and senses near infrared light at night), a personal identification camera (a camera to be used for identifying a person with near infrared light which is hardly influenced by external light) or an on-board camera (a camera to be mounted in a vehicle to assist night vision and provide far visual field), as an image sensor for detection of near infrared light in medical applications, as a light detecting device (photo-detector) which detects light in a wider wavelength range, or as an avalanche photodiode. Further, the photoelectric conversion device 1 is also applicable to a solar cell.

The photoelectric conversion device 1 includes a substrate 1, a plurality of pixels 3, a transparent electrode layer 4, a metal electrode layer 6, and a plurality of pads 7.

The substrate 2 is made of, for example, silicon (Si). The substrate 2 has a size of, for example, 5 to 10 mm square. The substrate 2 has a light receiving region 8 provided in a center portion thereof, and a peripheral region 9 surrounding the light receiving region 8. The substrate 2 has a thickness of, for example, 400 μm to 1000 μm. Where the photoelectric conversion device 1 is used for the solar cell, the substrate 2 may be made of blue glass (SLG). In this case, the substrate 2 preferably has a rectangular shape having a size of 50 cm×100 cm, and a thickness of 2 mm.

In this embodiment, the pixels 3 are arranged in a matrix array in the light receiving region 8. The pixels 3 each include a single lower electrode layer 10. The transparent electrode layer 4 is provided over the pixels 3 so as to collectively cover the pixels 3 arranged in the matrix array.

The metal electrode layer 6 is made of, for example, aluminum (Al). The metal electrode layer 6 is provided in the peripheral region 9 and has a ring shape which surrounds the transparent electrode layer 4 and covers a peripheral edge portion 41 of the transparent electrode layer 4. Thus, the metal electrode layer 6 is connected to the peripheral edge portion 41 of the transparent electrode layer 4.

The pads 7 are arranged in spaced relation from each other, and disposed in a region spaced from the metal electrode layer 6. In this embodiment, the pads 7 are linearly arranged along edges of the substrate 2. At least one of the pads 7 (which may be a single pad 7 or may be plural pads 7) is connected to the metal electrode layer 6 via a pad connection portion 11 formed integrally with the metal electrode layer 6. The pad connection portion 11 extends between this pad 7 and the metal electrode layer 6.

Figure 2:
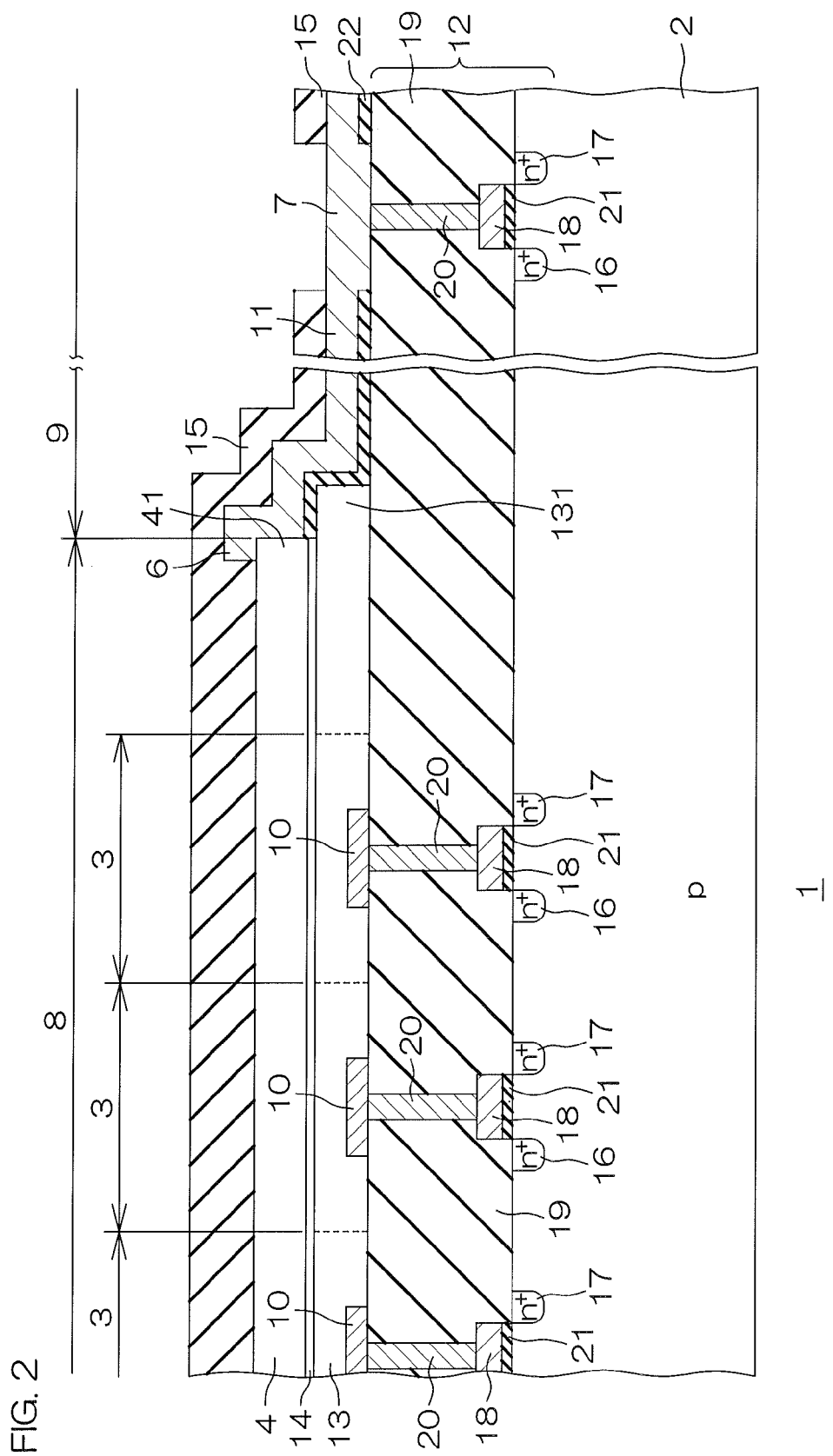
FIG. 2 is a sectional view taken along a sectional plane II-II in FIG. 1.

Next, the sectional structure of the photoelectric conversion device 1 will be described. FIG. 2 is a sectional view taken along a sectional plane II-II in FIG. 1.

In the photoelectric conversion device 1, a circuit portion 12, the lower electrode layers 10, a compound semiconductor layer 13, a buffer layer 14, the transparent electrode layer 4, the metal electrode layer 6 and a surface protection film 15 are provided on the substrate 2.

The circuit portion 12 includes, for example, CMOS field effect transistors. In FIG. 2, the circuit portion 12 is illustrated as including a plurality of n-channel MOS transistors which constitute parts of the CMOS field effect transistors. The n-channel MOS transistors each include a source layer 16 and a drain layer 17 provided selectively in a surface portion of the substrate 2, a gate electrode 18 disposed between the source layer 16 and the drain layer 17, an interlevel film 19 provided on the substrate 2 as covering the gate electrode 18, and a via-electrode 20 extending through the interlevel film 19. A gate insulation film 21 is provided between the gate electrode 18 and the substrate 2.

At least one of the via-electrodes 20 (which may be a single via-electrode 20 or may be plural via-electrodes 20) is connected between the corresponding lower electrode layer 10 and the corresponding gate electrode 18. Since the lower electrode layer 10 (anode) is connected to the gate electrode 18, light information (electrical signal) detected by the compound semiconductor layer 13 is amplified by the corresponding n-channel MOS transistor. The other via-electrodes 20 (which may be a single via-electrode 20 or may be plural via-electrodes 20) are connected between the pads 7 and the corresponding gate electrodes 18. Thus, the metal electrode layer 6 is electrically connected to the circuit portion 12 in the peripheral region 9. In FIG. 2, the circuit portion 12 is illustrated as having an exemplary structure, but may be such that the CMOS thin film transistors are provided in a thin film formed on a glass substrate.

The lower electrode layers 10 are arranged in a matrix array on the interlevel film 19. The lower electrode layers 10 are made of, for example, molybdenum (Mo), niobium (Nb), tantalum (Ta) or tungsten (W). Among these materials, tungsten (W) is preferred. Since tungsten (W) has a higher reflectivity than the other materials, not only light incident on the compound semiconductor layer 13 but also light reflected on the lower electrode layers 10 can be detected by the compound semiconductor layer 13. Further, tungsten (W) can be easily processed by utilizing an LSI manufacturing technology, thereby facilitating the size control of the lower electrode layers 10.

The compound semiconductor layer 13 collectively covers the lower electrode layers 10, and is partitioned into the plural pixels 3. The compound semiconductor layer 13 preferably has a thickness of 0.1 μm to 2 μm, more specifically a thickness of about 1.0 μm. Where the photoelectric conversion device 1 is used for the solar cell, the compound semiconductor layer 13 preferably has a thickness of about 1.8 μm. The compound semiconductor layer 13 is made of a CIGS semiconductor represented by $Cu_y(In_xGa_{1-x})Se_2$ ($0 \leq y \leq 1$, $0 \leq x \leq 1$). The specific compositional structure of the compound semiconductor layer 13 will be detailed later.

The buffer layer 14 covers substantially the entire upper surface of the compound semiconductor layer 13. The compound semiconductor layer 13 has a peripheral edge portion 131 which is uncovered with the buffer layer 14 and laterally extends from the buffer layer 14 along the surface of the substrate 2. An insulation film 22 covers (the upper surface and the side surface of) the peripheral edge portion 131 of the compound semiconductor layer 13 and the upper surface of the interlevel film 19 around the compound semiconductor layer 13. The buffer layer 14 has a thickness of, for example, 100 Å to 10,000 Å. The buffer layer 14 is preferably made of CdS, ZnS, ZnO, $(Zn_zMg_{1-z})O$ ($0 \leq z \leq 1$), ZnSe or $In_2S_3$.

The transparent electrode layer 4 covers the entire upper surface of the buffer layer 14. The transparent electrode layer 4 has a thickness of, for example, 100 Å to 10,000 Å. The transparent electrode layer 4 is preferably made of zinc oxide (ZnO), and may have a layered structure, for example, including a non-doped ZnO film (i-ZnO) and an n-type ZnO film (n-ZnO) provided in this order from a side closer to the compound semiconductor layer 13. Further, the transparent electrode layer 4 may be made of indium tin oxide (ITO).

The metal electrode layer 6 is partly rested on the stack of the compound semiconductor layer 13, the buffer layer 14 and the transparent electrode layer 4, and a top portion of the metal electrode layer 6 covers (the upper surface and the side surface of) the peripheral edge portion 41 of the transparent electrode layer 4. The metal electrode layer 6 is isolated from the compound semiconductor layer 13 and the buffer layer 14 by the insulation film 22. A lower portion of the metal electrode layer 6 laterally extends on the interlevel film 19 along the surface of the substrate 2 to be connected to the pad 7 via the pad connection portion 11.

The surface protection film 15 is made of, for example, an insulative material such as silicon nitride ($Si_3N_4$). The surface protection film 15 covers the metal electrode layer 6, the pad connection portion 11 and the pads 7. The metal electrode layer 6 is completely covered with the surface protection film 15 so as not to be exposed. The pads 7 are partly selectively exposed from openings formed in the surface protection film 15.

Figure 3:
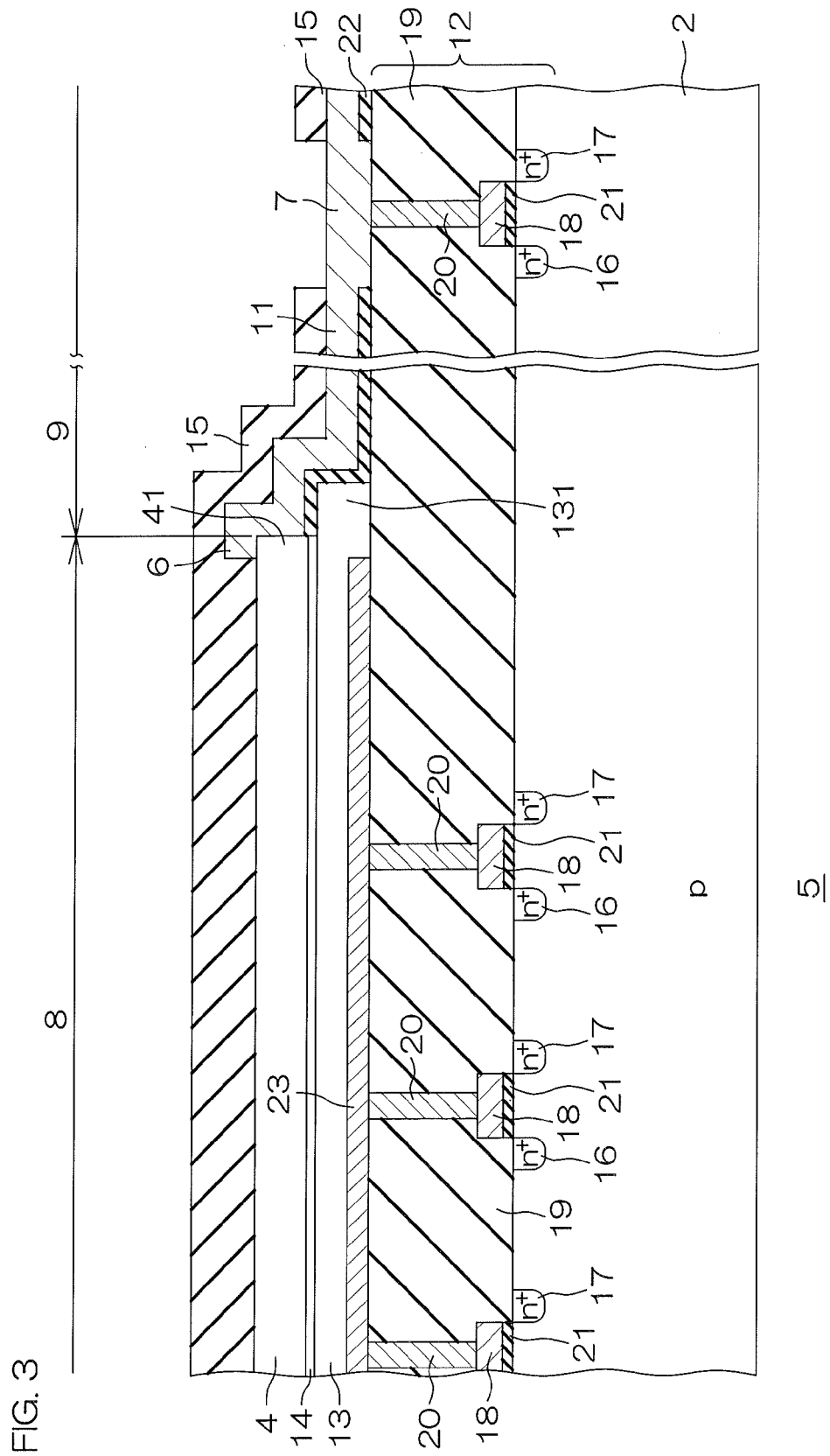
FIG. 3 is a schematic sectional view of a photoelectric conversion device according to a second embodiment of the present invention.

FIG. 3 is a schematic sectional view of a photoelectric conversion device according to a second embodiment of the present invention. In FIG. 3, components corresponding to those shown in FIG. 2 will be designated by the same reference characters as in FIG. 2.

In the photoelectric conversion device 1 according to the first embodiment, the lower electrode layers 10 are provided in one-to-one correspondence with the respective pixels 3, and arranged in a matrix array as a whole. In contrast, the photoelectric conversion device 5 according to the second embodiment includes a single lower electrode layer 23 provided on the interlevel film 19. Therefore, a compound semiconductor layer 13 covering the lower electrode layer 23 is not partitioned into a plurality of pixels. The photoelectric conversion device 5 having such a construction is advantageously used as a solar cell.

Figure 4:
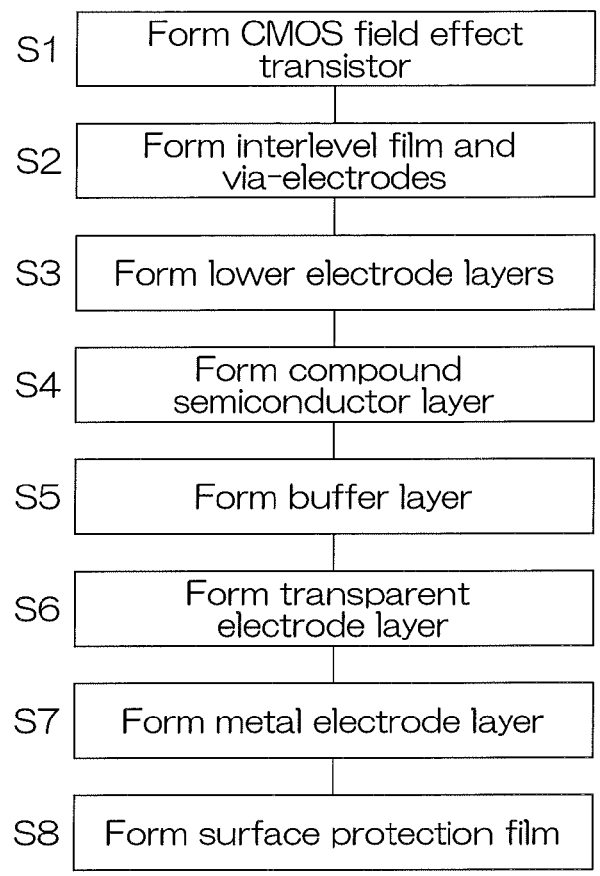
FIG. 4 is a flow diagram for explaining an exemplary photoelectric conversion device manufacturing process.
Figure 5:
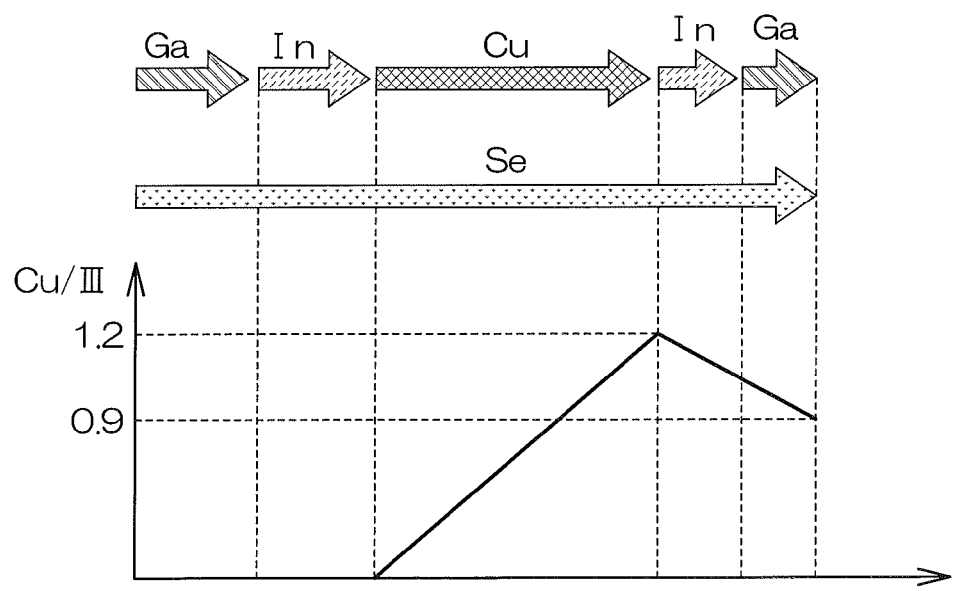
FIG. 5 is a time chart for explaining a process for formation of a compound semiconductor layer.

FIG. 4 is a flow diagram for explaining an exemplary process for manufacturing the photoelectric conversion device 1. FIG. 5 is a time chart for explaining a process for formation of the compound semiconductor layer 13.

Referring to FIGS. 4 and 5, the method of manufacturing the photoelectric conversion device 1 will be described.

In the method of manufacturing the photoelectric conversion device 1, CMOS field effect transistors are first formed on a substrate 2 (Step S1). Then, an interlevel film 19 is formed on the substrate 2, for example, by a CVD (Chemical Vapor Deposition) method, and via-electrodes 20 are formed as extending through the interlevel film 19 to gate electrodes 18 (Step S2). In turn, molybdenum (Mo) is deposited on the interlevel film 19, for example, by a sputtering method, and then patterned (etched), whereby a plurality of lower electrode layers 10 are formed in a matrix array (Step S3).

Next, a compound semiconductor layer 13 is formed (Step S4). In this step, as shown in FIG. 5, first to fifth steps are sequentially performed by an MBE (Molecular Beam Epitaxy) method (five-step process). This process is finished with the fifth step. In the first to fifth steps, a common condition is a film forming temperature of 350° C. to 600° C. Throughout the first to fifth steps, Se is constantly supplied at a constant flow rate (e.g., at a Se flux of $1\times10^3$ Pa to $5\times10^3$ Pa).

The first step is a Ga excessively supplying step in which Ga is supplied in a greater amount than In. In the first step, a Ga-to-In flux ratio (Ga/In) is controlled, for example, within a range of 1 to ∞. The first step ends when a film is deposited to a thickness of about 0.2 μm to about 0.3 μm (in a period of about 2200 seconds to about 3960 seconds).

The second step is an In excessively supplying step in which In is supplied in a greater amount than Ga. In the second step, an In-to-Ga flux ratio (In/Ga) is controlled, for example, within a range of 1 to ∞. The second step ends when a film is deposited to a thickness of about 0.2 μm to about 0.3 μm (in a period of about 3000 seconds to about 5400 seconds).

The third step is a Cu supplying step in which Cu is supplied. In the third step, the supplied Cu is diffused into the Ga film and the In film previously deposited, whereby a CGS (CuGaSe)-like compositional structure and a CIS (CuInSe)-like compositional structure are formed from these elements. The third step ends when the composition ratio (Cu/III) of Cu to Ga and In (which are collectively referred to as Group IIIB element) reaches about 1.2 (in a period of about 1800 seconds to about 3240 seconds). The final target composition ratio (Cu/III) is determined, for example, based on a change in the temperature of the substrate 2. For example, a time point at which the temperature of the substrate 2 is reduced by about 0.01° C. to about 1° C. may be defined as a time point at which the Cu/III becomes 1.0.

The fourth step is an In excessively supplying step like the second step. The fourth step may employ the same flux ratio (In/Ga) as the second step. The fourth step ends when a film is deposited to a thickness of about 0.1 μm to about 0.15 μm (in a period of about 1500 seconds to about 2700 seconds).

The fifth step is a Ga excessively supplying step like the first step. The fifth step may employ the same flux ratio (Ga/In) as the first step. The fifth step ends when a film is deposited to a thickness of about 0.1 μm to about 0.15 μm (in a period of about 1100 seconds to about 1980 seconds).

The compound semiconductor layer 13 is formed through the five-step process described above. After the Cu supplying step (third step), Cu is diffused into the In film and the Ga film respectively deposited in the fourth step and the fifth step, whereby a CGS-like compositional structure and a CIS-like compositional structure are formed from these elements. At the end of the fifth step, therefore, the Cu/III composition ratio of the compound semiconductor layer 13 is about 0.6 to about 0.9.

The process for the formation of the compound semiconductor layer 13 is not limited to the five-step process described above, but various processes may be employed within the scope of the present invention. A list of usable examples of the process is shown in FIG. 6.

Figure 6:
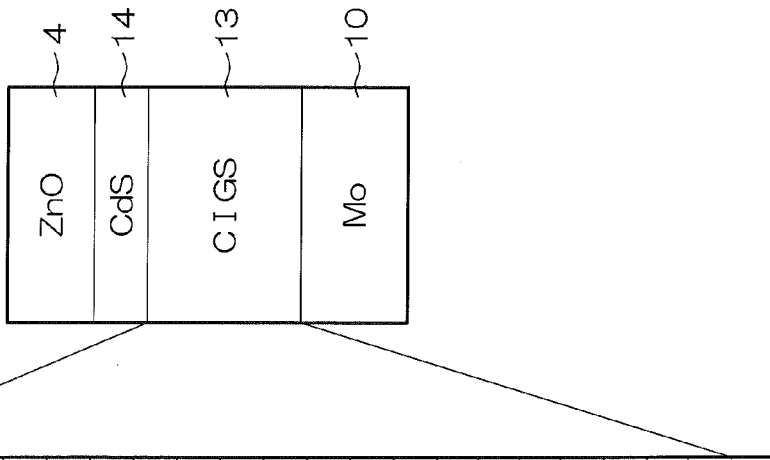
FIG. 6 is a list of variations of the process for the formation of the compound semiconductor layer.

FIG. 6 is a list of variations of the process for the formation of the compound semiconductor layer 13. In FIG. 6, Example 1 (the process shown in FIG. 5) to Example 9 as variations of the present invention and Prior-Art Example as the prior-art process are shown in respective columns. Further, material supplying steps for the formation of the compound semiconductor layer 13 are shown in vertical order. In FIG. 6, a portion of the compound semiconductor layer 13 closer to the lower electrode layer 10 is shown on a lower side, and a portion of the compound semiconductor layer 13 closer to the buffer layer 14 is shown on an upper side. Numeric values shown beside the material supplying steps are depths (μm) as measured from the surface of the compound semiconductor layer 13.

In FIG. 6, the material supplying steps are each shown in an abbreviated form. "GaIn" indicates the step of supplying Ga and In at a film formation rate ratio (Ga/In) of 0.3 to 0.6, and "Cu" indicates the Cu supplying step. "Ga" indicates the Ga excessively supplying step, and "In" indicates the In excessively supplying step.

In Prior-Art Example, the compound semiconductor layer 13 is formed by the three-step process in which the GaIn supplying step, the Cu supplying step and the GaIn supplying step are performed in this order. In Example 2, on the other hand, the compound semiconductor layer 13 is formed by the five-step process in which the Ga excessively supplying step, the In excessively supplying step, the Cu supplying step, the Ga excessively supplying step and the In excessively supplying step are performed in this order. In Example 5, the compound semiconductor layer 13 is formed by the four-step process in which the Ga excessively supplying step, the In excessively supplying step, the Cu supplying step and the GaIn supplying step are performed in this order.

After the formation of the compound semiconductor layer 13, a buffer layer 14 and a transparent electrode layer 4 are formed in this order, for example, by a CVD method, and then collectively patterned (Steps S5 and S6). In turn, a metal electrode layer 6 is formed, for example, by a sputtering method (Step S7), and a surface protection film 15 is formed, for example, by a CVD method (Step S8). Through these steps, the photoelectric conversion device 1 shown in FIGS. 1 and 2 is obtained.

Figure 7:
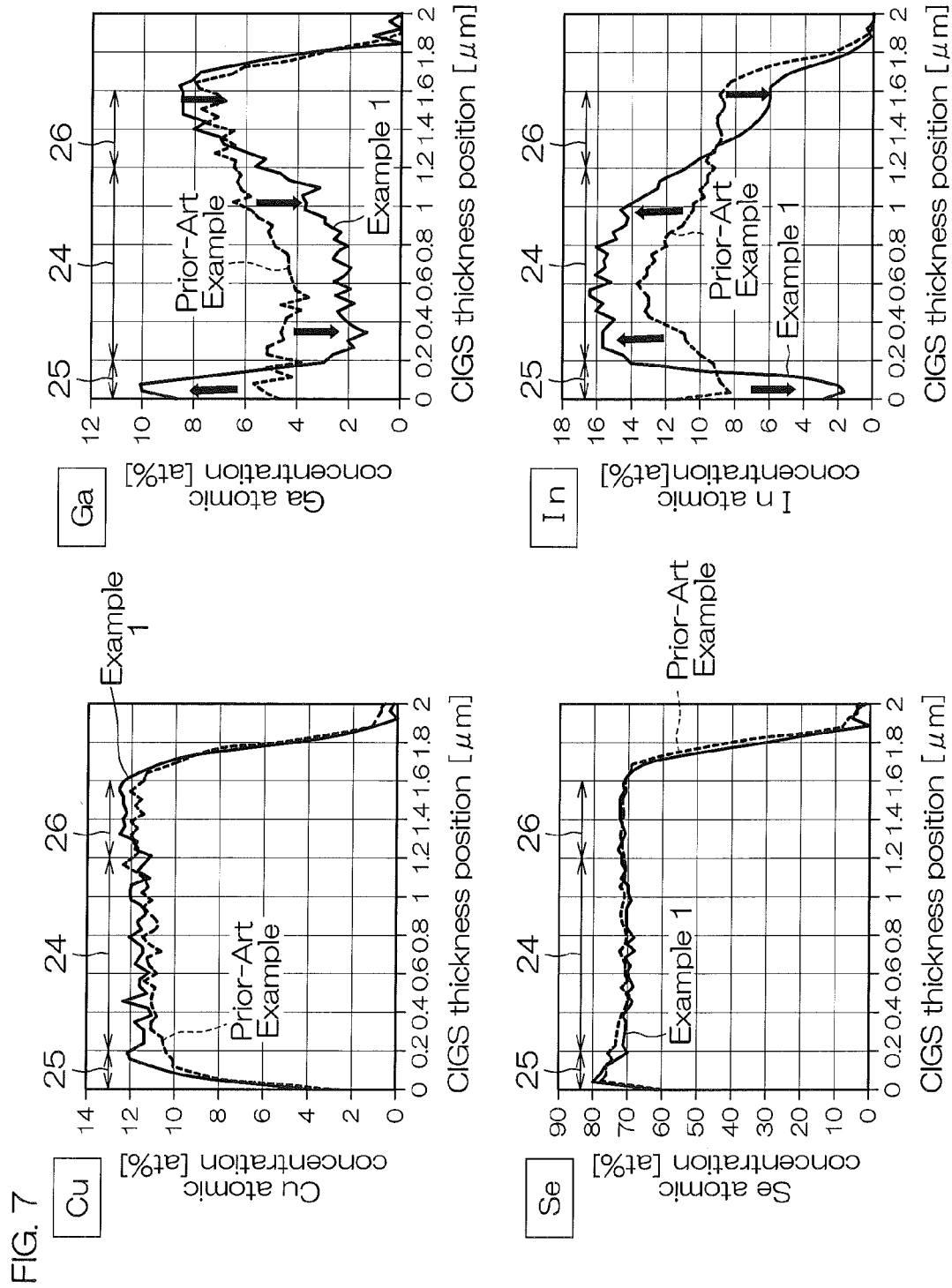
FIG. 7 is graphs showing relationships between the thicknesses of the compound semiconductor layers and the atomic concentrations of respective elements.

FIG. 7 is graphs showing relationships between the thicknesses of the compound semiconductor layers 13 (CIGS thicknesses) and the atomic concentrations of the respective elements. In FIG. 7, variations in Ga and In atomic concentrations (content variations) in Prior-Art Example and Example 1 are compared with each other.

The results shown in the graphs of FIG. 7 for Prior-Art Example in which the GaIn supplying step is performed before and after the Cu supplying step indicate that the Ga atomic concentration (the Ga composition ratio of the compound semiconductor layer 13) and the In atomic concentration (the In composition ratio of the compound semiconductor layer 13) do not significantly vary in the thickness direction of the compound semiconductor layer 13. For example, a difference between the maximum value and the minimum value of the Ga atomic concentration (content variation) is about 4%, and a difference between the maximum value and the minimum value of the In atomic concentration is about 5%.

In contrast, the results shown in the graphs of FIG. 7 for Example 1 in which the five-step process is employed, the Ga atomic concentration has a maximum variation of not less than 5%, and the In atomic concentration has a maximum variation of not less than 6%.

Particularly, the In atomic concentration is significantly greater than the Ga atomic concentration in an intermediate portion 24 ranging from a 0.2-nm thickness position to a 1.2-nm thickness position of the compound semiconductor layer 13. More specifically, the intermediate portion 24 has an In atomic concentration of 11 at % to 16 at %, while having a Ga atomic concentration of only 1 at % to 5 at %. The atomic concentrations are percentages based on the total amount of atoms including Cu, Se and the like contained in the compound semiconductor layer 13. Therefore, where the Ga composition ratio and the In composition ratio of the intermediate portion 24 based on the total amount of Ga and In are calculated, the Ga composition ratio (Ga/Ga+In) is 0.08 to 0.24, and the In composition ratio (In/Ga+In) is 0.76 to 0.92. It is noted that the Ga composition ratio and the In composition ratio are values determined with the amounts of Cu and Se excluded. Although the Ga composition ratio and the In composition ratio based on the total amount of all the atoms contained in the compound semiconductor layer 13 vary with the Cu content and the Se content, the Ga composition ratio (Ga/Ga+In) and the In composition ratio (In/Ga+In) are kept constant.

On the other hand, the Ga atomic concentration is significantly greater than the In atomic concentration in a lower end portion 25 (ranging from a 0-µm thickness position to a 0.2-µm thickness position) and an upper end portion 26 (ranging from a 1.2-µm thickness position to a 1.6-µm thickness position) on opposite sides of the intermediate portion 24 with respect to the thickness direction of the compound semiconductor layer 13. More specifically, the lower end portion 25 and the upper end portion 26 each have a Ga atomic concentration of 7 at % to 10 at %, while having an In atomic concentration of only 2 at % to 9 at %. Where the Ga composition ratio and the In composition ratio of each of the lower end portion 25 and the upper end portion 26 based on the total amount of Ga and In are calculated, the Ga composition ratio (Ga/Ga+In) is 0.53 to 0.78, and the In composition ratio (In/Ga+In) is 0.22 to 0.47.

A difference in Ga atomic concentration between the intermediate portion 24 and the lower and upper end portions 25, 26 is a maximum Ga content variation (about 8.5%) in the compound semiconductor layer 13. Further, a difference in In atomic concentration between the intermediate portion 24 and the lower and upper end portions 25, 26 is a maximum In content variation (about 14.5%) in the compound semiconductor layer 13.

That is, the gradations (variations) in the composition ratios of Ga and In are greater in Example 1 than in Prior-Art Example as shown in FIG. 7.

Figure 8:
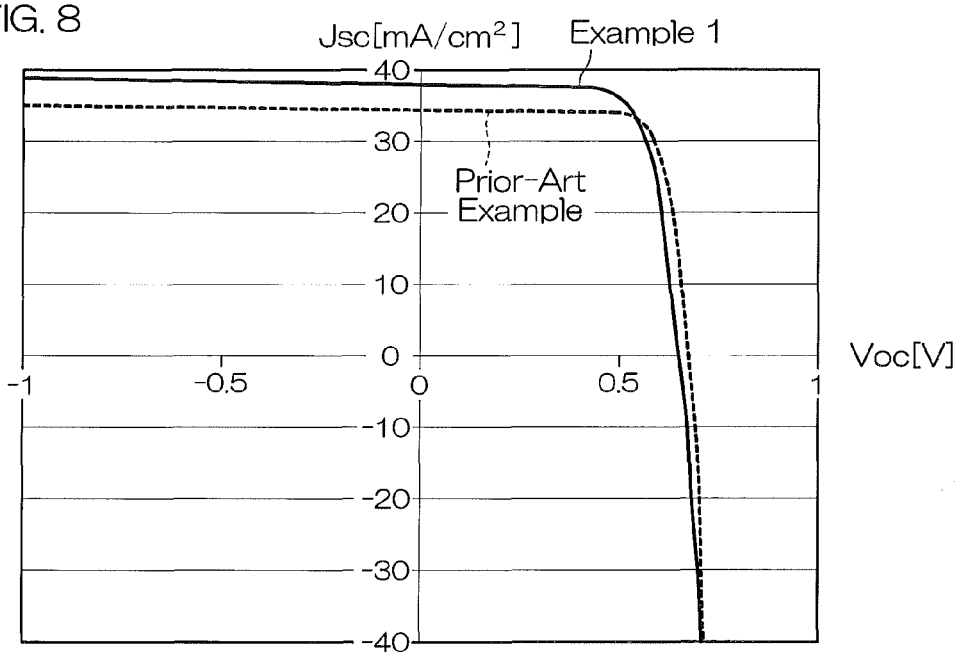
FIG. 8 is a graph showing the J-V characteristics of the photoelectric conversion devices.

FIG. 8 is a graph showing the J-V characteristics of the photoelectric conversion devices 1. In FIG. 8, Example 1 shown in FIG. 6 is compared with Prior-Art Example for J-V characteristics observed when the photoelectric conversion devices 1 were used as solar cells. As a result, it was found that the photoelectric conversion device of Example 1 having greater gradations (variations) in the composition ratios of Ga and In, is more excellent in J-V characteristics.

Figure 9:
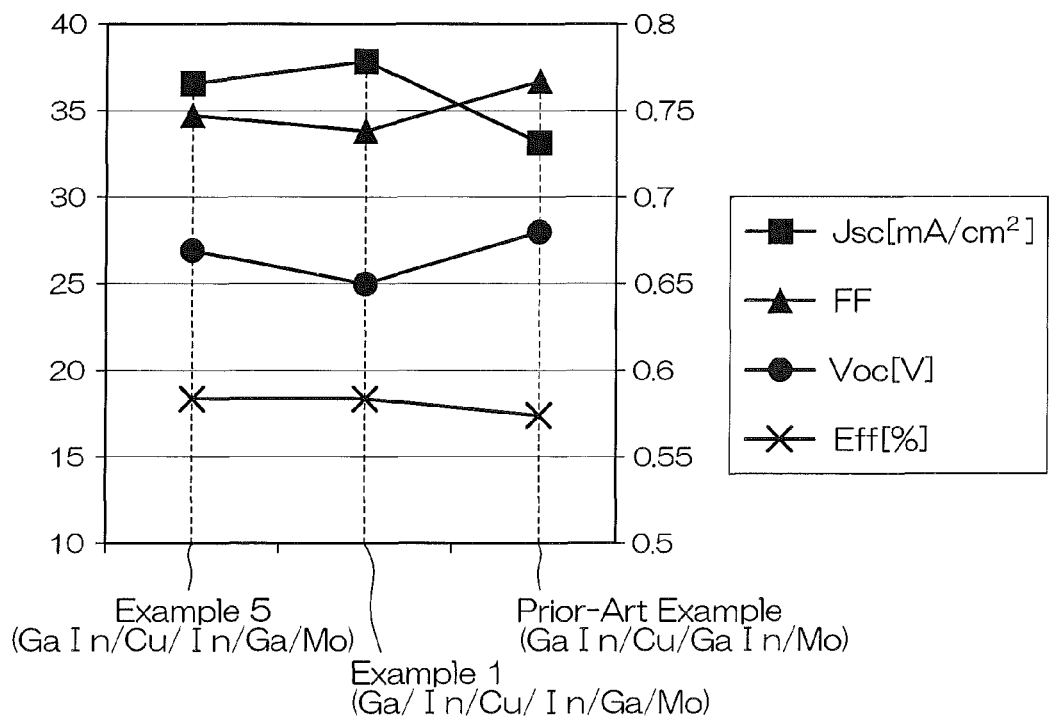
FIG. 9 is a graph showing the solar cell characteristic properties of the photoelectric conversion devices.

FIG. 9 is a graph showing the solar cell characteristic properties of the photoelectric conversion devices 1. In FIG. 9, Examples 1 and 5 shown in FIG. 6 are compared with Prior-Art Example for characteristic properties observed when the photoelectric conversion devices 1 were used as solar cells. Four characteristic properties including a short circuit current Jsc, a fill factor FF, an open current Voc and a conversion efficiency Eff were checked.

As a result, it was found that the photoelectric conversion devices of Examples 1 and 5 each having greater gradations (variations) in the composition ratios of Ga and In, have conversion efficiencies Eff of 18.3% and 18.2%, respectively, which are improved over Prior-Art Example (17.4%).

Figure 10:
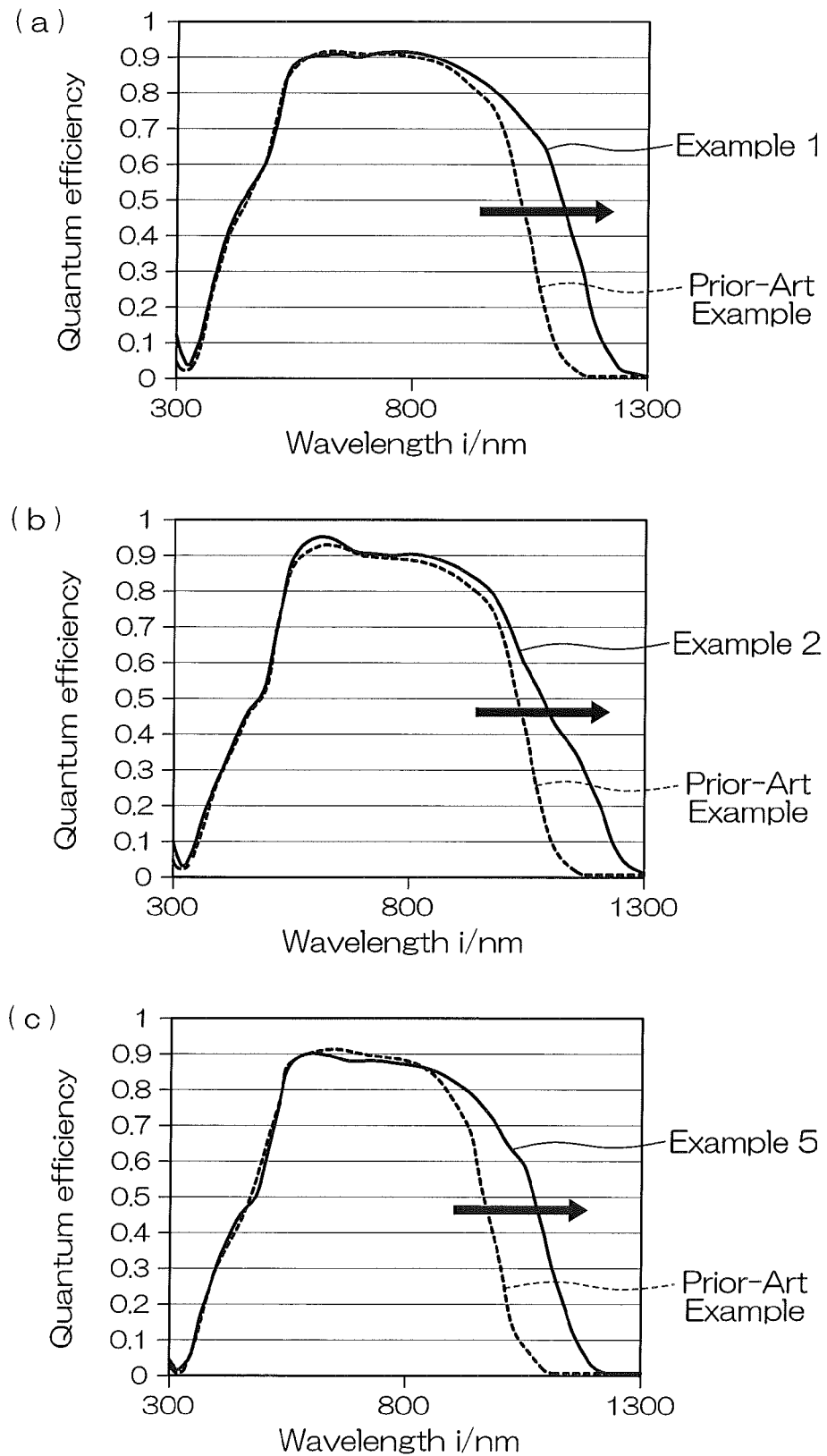
FIGS. 10(a) to 10(c) are graphs showing relationships between the wavelengths and the quantum efficiencies of the photoelectric conversion devices.

FIGS. 10(a) to 10(c) are graphs showing relationships between the wavelengths and the quantum efficiencies of the photoelectric conversion devices. In FIGS. 10(a) to 10(c), Examples 1, 2 and 5 shown in FIG. 6 are compared with Prior-Art Example for increase in {sensitivity} wavelength observed when the photoelectric conversion devices 1 were used as solar cells. FIG. 10(a) shows a comparison between Example 1 and Prior-Art Example. FIG. 10(b) shows a comparison between Example 2 and Prior-Art Example, and FIG. 10(c) shows a comparison between Example 5 and Prior-Art Example.

FIGS. 10(a) to 10(c) indicate that the spectral sensitivity wavelengths of the photoelectric conversion devices of Examples 1, 2 and 5 each having greater gradations (variations) in the composition ratios of Ga and In, can be increased up to 1300 nm, which is longer than that of Prior-Art Example (1200 nm). That is, FIGS. 10(a) to 10(c) indicate that the compound semiconductor layer 13 is allowed to have the CIS compositional structure or the CIS-like compositional structure by increasing the gradations (variations) in the composition ratios of Ga and In of the compound semiconductor layer 13, and the spectral sensitivity wavelength is increased by this compositional structure.

FIG. 11 is a graph showing the dark current characteristics of the photoelectric conversion devices 1. In FIG. 11, Example 5 shown in FIG. 6 is compared with Prior-Art Example for the dark current characteristics observed when the photoelectric conversion devices 1 were used as image sensors. As a result, it was found that the photoelectric conversion device of Example 5 having greater gradations (variations) in the composition ratios of Ga and In, has a lower dark current than Prior-Art Example. That is, FIG. 11 indicates that the compound semiconductor layer 13 is allowed to have the CGS compositional structure or the CGS-like compositional structure by increasing the gradations (variations) in the composition ratios of Ga and In of the compound semiconductor layer 13, and the dark current is reduced by this compositional structure. It is noted that the dark current can be further reduced by controlling the number of times of the Ga excessively supplying step and the order of the Ga excessively supplying step and the other process steps when the compound semiconductor layer 13 is formed by the multi-step process.

Experiments shown in FIGS. 7 to 11 proved that the CIS or CIS-like compositional structure and the CGS or CGS-like compositional structure can coexist in the CIGS compound semiconductor layers 13 of the photoelectric conversion devices 1, 5. Therefore, the sensitivity wavelength can be increased by the CIS or CIS-like compositional structure (see FIG. 10), and the dark current can be reduced by the CGS or CGS-like compositional structure (see FIG. 11).

That is, the increase in sensitivity wavelength and the reduction in dark current can be simultaneously achieved.

While the embodiments of the present invention have been described, the invention may be embodied in other ways.

For example, any of various circuit elements such as capacitors and resistors may be provided in addition to the CMOS field effect transistors on the substrate 2. Further, an integrated circuit such as an SSI (Small Scale Integration), an MSI (Medium Scale Integration), an LSI (Large Scale Integration), a VLSI (Very Large Scale Integration) or a ULSI (Ultra-Very Large Scale Integration) may be constructed by these circuit elements.

It should be understood that the embodiments of the present invention are merely illustrative of the technical principles of the present invention but not limitative of the invention. The spirit and scope of the present invention are to be limited only by the appended claims.

This application corresponds to Japanese Patent Application No. 2012-229142 filed in the Japan Patent Office on Oct. 16, 2012, the disclosure of which is incorporated herein by reference in its entirety.

REFERENCE SIGNS LIST

1 PHOTOELECTRIC CONVERSION DEVICE
2 SUBSTRATE
3 PIXEL
4 TRANSPARENT ELECTRODE LAYER
5 PHOTOELECTRIC CONVERSION DEVICE
10 LOWER ELECTRODE LAYER
12 CIRCUIT PORTION
13 COMPOUND SEMICONDUCTOR LAYER
14 BUFFER LAYER
16 SOURCE LAYER
17 DRAIN LAYER
18 GATE ELECTRODE
22 INSULATION FILM
23 LOWER ELECTRODE LAYER
24 INTERMEDIATE PORTION
25 LOWER END PORTION
26 UPPER END PORTION

The invention claimed is:

1. A photoelectric conversion device comprising:
a substrate;
a lower electrode layer provided on the substrate;
a CIGS compound semiconductor layer provided on the lower electrode layer as covering the lower electrode layer; and
a transparent electrode layer provided on the compound semiconductor layer;
wherein the compound semiconductor layer has a Ga content having a maximum variation of not less than 5% as measured in a layer thickness direction, and has an In content having a maximum variation of not less than 6% as measured in the layer thickness direction, the Ga content and the In content varying continuously in the layer thickness direction.

2. The photoelectric conversion device according to claim 1, wherein the compound semiconductor layer includes an intermediate portion in which the In content is greater than the Ga content, and an end portion in which the Ga content is greater than the In content, the end portion being disposed on an upper side and/or a lower side of the intermediate portion with respect to the layer thickness direction.

3. The photoelectric conversion device according to claim 2, wherein a difference in Ga content between the end portion and the intermediate portion is not less than 5%, and a difference in In content between the intermediate portion and the end portion is not less than 6%.

4. The photoelectric conversion device according to claim 2, wherein the intermediate portion has an In content of 14 at % to 20 at % and a Ga content of 0 at % to 4 at %.

5. The photoelectric conversion device according to claim 2, wherein the intermediate portion has a Ga composition ratio (Ga/Ga+In) of 0 to 0.17 with respect to the total amount of Ga and In, and an In composition ratio (In/Ga+In) of 0.83 to 1with respect to the total amount of Ga and In.

6. The photoelectric conversion device according to claim 2, wherein the end portion has a Ga content of 6 at % to 15 at %, and an In content of 0 at % to 8 at %.

7. The photoelectric conversion device according to claim 2, wherein the end portion has a Ga composition ratio (Ga/Ga+In) of 0.65 to 1 with respect to the total amount of Ga and In, and an In composition ratio (In/Ga+In) of 0 to 0.35 with respect to the total amount of Ga and In.

8. The photoelectric conversion device according to claim 1, wherein the compound semiconductor layer has an absorption wavelength of not less than 1200 nm.

9. The photoelectric conversion device according to claim 1,
wherein the lower electrode layer includes a plurality of lower electrode layers arranged in spaced relation,
wherein the compound semiconductor layer is disposed over the plurality of lower electrode layers as collectively covering the lower electrode layers, and include a plurality of compound semiconductor layer portions each defining a pixel.

10. The photoelectric conversion device according to claim 1, wherein the lower electrode layer includes a single lower electrode layer.

11. The photoelectric conversion device according to claim 1, further comprising a circuit portion provided between the substrate and the lower electrode layer.

12. The photoelectric conversion device according to claim 11, wherein the circuit portion includes a CMOS field effect transistor.

13. The photoelectric conversion device according to claim 12, wherein the CMOS field effect transistor includes a source layer and a drain layer formed selectively in a surface portion of the substrate, and a gate electrode disposed between the source layer and the drain layer.

14. The photoelectric conversion device according to claim 1, wherein the transparent electrode layer is made of zinc oxide (ZnO) or indium tin oxide (ITO).

15. The photoelectric conversion device according to claim 1, further comprising a buffer layer provided between the compound semiconductor layer and the transparent electrode layer.

16. The photoelectric conversion device according to claim 15, wherein the buffer layer is made of CdS, ZnS, ZnO, $(Zn_zMg_{1-z})O(0 \leq z \leq 1)$, ZnSe or $In_2S_3$.

* * * * *